(12) United States Patent
Yang et al.

(10) Patent No.: US 12,119,622 B2
(45) Date of Patent: Oct. 15, 2024

(54) POWER DISTRIBUTION MODULE AND COMMUNICATION POWER SUPPLY SYSTEM

(71) Applicant: Huawei Digital Power Technologies Co., Ltd., Shenzhen (CN)

(72) Inventors: Yanxing Yang, Dongguan (CN); Wei Guo, Dongguan (CN); Tao Feng, Dongguan (CN); Liqiong Yi, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 278 days.

(21) Appl. No.: 17/848,740

(22) Filed: Jun. 24, 2022

(65) Prior Publication Data

US 2022/0360054 A1 Nov. 10, 2022

Related U.S. Application Data

(63) Continuation of application No. PCT/CN2020/134734, filed on Dec. 9, 2020.

(30) Foreign Application Priority Data

Dec. 25, 2019 (CN) .......................... 201911358651.7

(51) Int. Cl.
*H02B 1/20* (2006.01)
*H01H 71/02* (2006.01)
(Continued)

(52) U.S. Cl.
CPC .......... *H02B 1/205* (2013.01); *H01H 71/0264* (2013.01); *H02B 1/0565* (2013.01); *H05K 7/1457* (2013.01)

(58) Field of Classification Search
CPC .... H02B 1/0565; H02B 1/205; H05K 7/1457; H01H 71/0264
See application file for complete search history.

(56) References Cited

U.S. PATENT DOCUMENTS 6,002,580 A 12/1999 Levantine et al.
6,315,580 B1 11/2001 Hurtubise et al.
(Continued)

FOREIGN PATENT DOCUMENTS

CN 1761138 A 4/2006
CN 103107486 A 5/2013
(Continued)

*Primary Examiner* — Robert J Hoffberg
(74) *Attorney, Agent, or Firm* — Conley Rose, P.C.

(57) ABSTRACT

The power distribution module includes a power busbar, a primary load output module, a secondary load output module, a battery module, and a signal-driven collection module, where each of the primary load output module, the secondary load output module, and the battery module includes a circuit breaker, the power busbar is connected to the circuit breaker, the signal-driven collection module is connected to the circuit breaker to collect a circuit breaker signal, the signal-driven collection module includes a plurality of first signal units sequentially arranged in a first direction, an integer quantity of first signal units are disposed in a connection area in which the signal-driven collection module is connected to each circuit breaker, and each circuit breaker is provided with a second signal unit.

20 Claims, 9 Drawing Sheets

(51) Int. Cl.
*H02B 1/056* (2006.01)
*H05K 7/14* (2006.01)

(56) References Cited

U.S. PATENT DOCUMENTS

| | | | |
|---|---|---|---|
| 6,317,311 B1 | 11/2001 | Middlehurst et al. | |
| 7,027,293 B2 * | 4/2006 | Yang | H02B 1/04 |
| | | | 361/647 |
| 9,618,548 B1 * | 4/2017 | Melecio Ramirez | G01R 22/10 |
| 11,670,473 B2 * | 6/2023 | Yang | H01H 71/1009 |
| | | | 200/50.32 |
| 11,875,961 B2 * | 1/2024 | Long | H01H 73/08 |
| 2016/0165744 A1 | 6/2016 | Bailey et al. | |
| 2018/0254615 A1 * | 9/2018 | Asanza Maldonado | |
| | | | H02B 1/056 |
| 2021/0288474 A1 * | 9/2021 | Fenker | H01R 9/2658 |
| 2022/0285885 A1 * | 9/2022 | Yin | H01H 71/08 |
| 2023/0054526 A1 * | 2/2023 | Liang | H01H 71/02 |
| 2024/0130067 A1 * | 4/2024 | Ma | H05K 7/1492 |

FOREIGN PATENT DOCUMENTS

| | | |
|---|---|---|
| CN | 203466434 U | 3/2014 |
| CN | 204424700 U | 6/2015 |
| CN | 204793630 U | 11/2015 |
| CN | 204835527 U | 12/2015 |
| CN | 206332331 U | 7/2017 |
| EP | 0252512 A1 | 1/1988 |
| IN | 110048310 A | 7/2019 |

* cited by examiner

POWER DISTRIBUTION MODULE AND COMMUNICATION POWER SUPPLY SYSTEM

CROSS-REFERENCE TO RELATED APPLICATIONS

This is a continuation of International Patent Application No. PCT/CN2020/134734 filed on Dec. 9, 2020, which claims priority to Chinese Patent Application No. 201911358651.7 filed on Dec. 25, 2019. The disclosures of the aforementioned applications are hereby incorporated by reference in their entireties.

TECHNICAL FIELD

This disclosure relates to the field of communication power supply circuit technologies, and in particular, to a power distribution module and a communication power supply system.

BACKGROUND

Loads of a communication power supply system generally include a primary load and a secondary load. When there is no mains supply, a standby power supply such as a battery is used. A primary load, a secondary load, and a battery are powered on and off by controlling corresponding circuit breakers by a contactor. Based on functionality of branches to which circuit breakers belong, copper bars to be connected to the circuit breakers need to be manufactured into sectional type copper bars each with a matched function area, to limit a quantity of circuit breakers to be installed in each function area and function allocation of the function area.

SUMMARY

Implementations of this disclosure intend to resolve a technical problem of providing a power distribution module and a communication power supply system that can improve installation flexibility of a circuit breaker.

According to a first aspect, an implementation of this disclosure provides a power distribution module, including a power busbar, a primary load output module, a secondary load output module, a battery module, and a signal-driven collection module, where each of the primary load output module, the secondary load output module, and the battery module includes a circuit breaker, the power busbar is connected to the circuit breaker, the signal-driven collection module is connected to the circuit breaker to collect a circuit breaker signal, the signal-driven collection module includes a plurality of first signal units sequentially arranged in a first direction, an integer quantity of first signal units are disposed in a connection area in which the signal-driven collection module is connected to each circuit breaker, each circuit breaker is provided with a second signal unit, and the second signal unit interconnects with one of the integer quantity of first signal units in the connection area.

According to the power distribution module in this implementation of this disclosure, power is obtained by using the power busbar, the circuit breaker signal collected by the signal-driven collection module is fed back to a monitoring module, to control on and off (namely, powering off and on) of the circuit breaker of each of the primary load output module, the secondary load output module, and the battery module, monitoring of a status of the circuit breaker, and the like. In addition, no contactor is used for powering on and off and no current divider is used for current division. Therefore, no distinction is made on physical hardware between function areas accessed by a primary load, a secondary load, a battery, and the like.

In the first direction, an integer quantity of first signal units are disposed in the connection area in which the signal-driven collection module is connected to the circuit breaker. In other words, the circuit breaker is disposed in the first direction in a manner of corresponding to an integer quantity of first signal units of the signal-driven collection module, for example, one or two, so that hybrid connection between the signal-driven collection module and the circuit breakers of the primary load output module, the secondary load output module, and the battery module is implemented without limitation, thereby reducing secondary design and development due to users' requirements for a capacity and a quantity of circuit breakers in function areas accessed by a primary load, a secondary load, a battery, and the like, and improving flexibility of layout of the power distribution module.

In a possible implementation, the circuit breaker is provided with an insertion slot, the signal-driven collection module is inserted into insertion slots of all circuit breakers, the insertion slot extends in the first direction, an integer quantity of first signal units are disposed in a connection area in which the signal-driven collection module is inserted into the insertion slot, and the second signal unit is disposed in the insertion slot. The signal-driven collection module is connected to the circuit breaker in an insertion manner, which helps improve efficiency of assembling the signal-driven collection module with the circuit breaker, and also facilitates replacement of a circuit breaker in each function module (the primary load output module, the secondary load output module, the battery module, or the like).

In a possible implementation, the signal-driven collection module further includes a guide slot, and a guide slot is provided between every two adjacent first signal units to guide the signal-driven collection module when the signal-driven collection module is inserted into the insertion slot, facilitating connection between the signal-driven collection module and all the circuit breakers.

In a possible implementation, the signal-driven collection module further includes a main body and a plurality of guide pillars disposed on the main body in a protruding manner, a plurality of first signal units are disposed on the main body at intervals in the first direction, the main body is inserted into the insertion slots of all the circuit breakers, and the guide pillar is accommodated in the insertion slot. The guide pillar is configured to guide the signal-driven collection module when the signal-driven collection module is inserted into the insertion slot, facilitating connection between the signal-driven collection module and all the circuit breakers.

In a possible implementation, a guide slot is provided in the insertion slot, and each guide pillar is inserted into one guide slot in a matched manner, so that when the signal-driven collection module is inserted into the circuit breaker, the guide pillar moves along the guide slot to guide the signal-driven collection module into the circuit breaker, thereby improving smoothness of relative movement between the signal-driven collection module and the circuit breaker.

In a possible implementation, the main body includes a first surface and a second surface formed by bending and extending the first surface, a plurality of first signal units are disposed on the first surface of the main body at an equal interval in the first direction, a plurality of guide pillars are disposed on the second surface of the main body in a protruding manner at an equal interval, there is a gap between every two adjacent first signal units, and each guide pillar is disposed in a manner of corresponding to one gap. In this way, precision of interconnection between the first signal unit and the second signal unit can be improved when the guide pillar is used for guiding, and stability of connection between the signal-driven collection module and the insertion slot is also improved, thereby improving reliability of the power distribution module.

In a possible implementation, the power distribution module further includes a support frame, the support frame includes a support body and a plurality of guide members disposed on the support body in a protruding manner at intervals in the first direction, a guide slot is further provided in the circuit breaker, and the guide slot is matched with the guide member. The guide member and the guide slot form a guide structure. In other words, the circuit breaker is installed on the support frame in a guide rail type installation manner. Because of a guiding effect of the guide member on the circuit breaker, precision and efficiency of assembling the circuit breaker on the support frame are improved.

In a possible implementation, the guide member includes a connection part and a guide part, the connection part is fixedly connected to the support body, the guide part is formed by bending and extending a side edge of the connection part in a direction away from the support body, every two adjacent guide parts have a same width as a width of the first signal unit, and every two adjacent guide parts are disposed in a manner of corresponding to one first signal unit. The guide member is of an edge bending structure, thereby being simple in structure and easy to operate. In addition, two adjacent guide parts have a same width as the width of the first signal unit, and every two adjacent guide parts are disposed in a manner of corresponding to one first signal unit, so that an integer quantity of first signal units are to be disposed correspondingly when the signal-driven collection module is inserted into the circuit breaker, thereby facilitating hybrid insertion of the signal-driven collection module into a circuit breaker of each function module without limitation, and also improving stability of connection between the signal-driven collection module and the insertion slot.

In a possible implementation, the signal-driven collection module further includes a main body, a plurality of first signal units are disposed on the main body at an equal interval, and the first signal unit is an elastic terminal. Because the first signal unit is an elastic terminal, the first signal unit can float to automatically adjust a position of the first signal unit when the first signal unit interconnects with the second signal unit, so that a signal collection terminal precisely interconnects with the second signal unit, thereby improving precision of interconnection between the first signal unit and the second signal unit.

In a possible implementation, the circuit breaker is further provided with a first slot and a second slot, the first slot, the insertion slot, and the second slot are provided at intervals in a second direction different from the first direction, the power busbar includes a positive power busbar and a negative power busbar, the positive power busbar is inserted into the first slot, and the negative power busbar is inserted into the second slot. The positive power busbar, the signal-driven collection module, and the negative power busbar are arranged in the second direction, simplifying wiring of the power distribution module, and also improving flexibility of layout of each function module of the power distribution module.

According to a second aspect, an implementation of this disclosure further provides a communication power supply system, including a rectifier module, the foregoing power distribution module, and a monitoring module, where the power busbar is connected to the rectifier module, the monitoring module is configured to receive a circuit breaker signal of the circuit breaker to control and monitor the circuit breaker, thereby improving electrical safety and reliability of the communication power supply system.

In a possible implementation, the primary load output module includes at least one primary load connected to a circuit breaker of the primary load output module, the secondary load output module includes at least one secondary load connected to a circuit breaker of the primary load output module, the battery module includes at least one battery connected to a circuit breaker of the battery module, and the monitoring module is further configured to monitor a voltage of a battery on the battery module, to control power supplied by the battery to the primary load and the secondary load. In this way, it is ensured that in an abnormal case, power supplied to the primary load and the secondary load is controlled by the monitoring module based on a capacity of the battery by monitoring a voltage of the battery, and the battery can be protected from overdischarge, thereby prolonging service life of the battery.

In a possible implementation, the power distribution module is a direct current power distribution module, the communication power supply system further includes an alternating current power distribution module, and the rectifier module is connected to the alternating current power distribution module, and is configured to convert alternating current mains supply into a direct current and provide the direct current for the power distribution module.

In a possible implementation, the alternating current power distribution module includes an alternating current power distribution unit and a lightning protection unit, the alternating current power distribution unit is connected to the rectifier module, and the lightning protection unit is configured to perform lightning protection detection on the alternating current power distribution unit and provide a detection result for the monitoring module.

DESCRIPTION OF EMBODIMENTS

Figure 1:
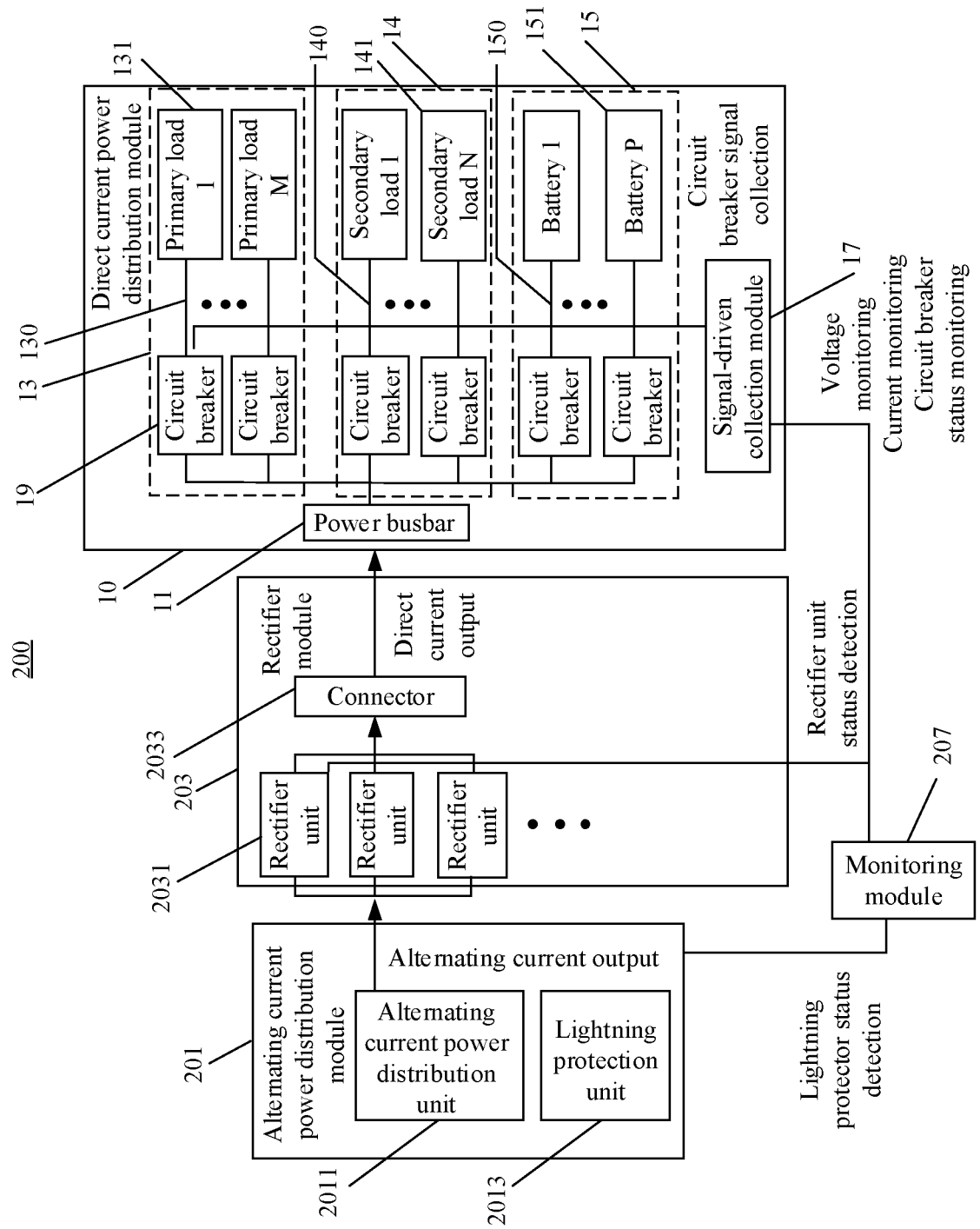
FIG. 1 is a block diagram of a structure of a communication power supply system according to a first implementation of this disclosure.

First Implementation:

FIG. 1 is a block diagram of a structure of a communication power supply system according to a first implementation of this disclosure. The communication power supply system 200 includes an alternating current power distribution module 201, a rectifier module 203, a direct current power distribution module 10, and a monitoring module 207.

The alternating current power distribution module 201 is configured to provide alternating current mains. The alternating current power distribution module 201 includes an alternating current power distribution unit 2011 and a lightning protection unit 2013. The lightning protection unit 2013 is configured to perform lightning protection detection on the alternating current power distribution unit 2011 and provide a detection result for the monitoring module 207.

The rectifier module 203 is connected to the alternating current power distribution unit 2011 of the alternating current power distribution module 201, and is configured to convert the alternating current mains into a direct current, and provide the direct current for the direct current power distribution module 10. The rectifier module 203 includes a plurality of rectifier units 2031 and a connector 2033 connected to the plurality of rectifier units 2031.

The direct current power distribution module 10 includes a power busbar 11, a primary load output module 13, a secondary load output module 14, a battery module 15, and a signal-driven collection module 17. The power busbar 11 is connected to the connector 2033 of the rectifier module 203. Each of the primary load output module 13, the secondary load output module 14, and the battery module 15 includes a circuit breaker 19.

The primary load output module 13 further includes a primary load 131 connected to the circuit breaker 19 of the primary load output module 13. The secondary load output module 14 further includes a secondary load 141 connected to the circuit breaker 19 of the secondary load output module 14. The battery module 15 further includes a battery 151 connected to the circuit breaker 19 of the battery module 15. The circuit breaker 19 of each of the primary load output module 13, the secondary load output module 14, and the battery module 15 is connected to the power busbar 11. The circuit breakers 19 of all function areas (accessed by the primary load 131, the secondary load 141, and the battery 151) share one power busbar 11, to simplify a structure of the direct current power distribution module 10. The rectifier module 203 is configured to supply power to the primary load 131, the secondary load 141, and the battery 151. The battery 151 is configured to supply power to the primary load 131 and the secondary load 141 when the rectifier module 203 cannot supply power.

Furthermore, the primary load output module 13 includes M primary load branches 130, and each primary load branch 130 is provided with a circuit breaker 19 and a primary load 131, where M is an integer greater than or equal to 1. The secondary load output module 14 includes N secondary load branches 140, and each secondary load branch 140 includes a circuit breaker 19 and a secondary load 141, where N is an integer greater than or equal to 1. The battery module 15 includes P battery branches 150, and each battery branch 150 has a circuit breaker 19 and a battery 151, where P is an integer greater than or equal to 1.

The signal-driven collection module 17 is connected to the circuit breaker 19 of each of the primary load output module 13, the secondary load output module 14, and the battery module 15, and is configured to collect a circuit breaker signal of the circuit breaker 19. The circuit breaker signal includes a switch-on signal, a switch-off signal, a circuit breaker address signal, a circuit breaker current signal, a circuit breaker voltage signal, a fault trip status signal, and the like.

The monitoring module 207 is configured to control and monitor the circuit breaker 19 based on the circuit breaker signal collected by the signal-driven collection module 17, to improve intelligence and reliability of the communication power supply system 200. For example, when the monitoring module 207 obtains an instruction requiring a circuit breaker 19 of a specific address to be switched off, the monitoring module 207 identifies the circuit breaker 19 of the corresponding address by using a collected circuit breaker signal, and controls the circuit breaker 19 to be switched off. For another example, the monitoring module 207 may monitor a status of the circuit breakers 19 by using an obtained circuit breaker current signal, to determine whether each circuit breaker 19 can effectively switch a circuit on and off, to improve electrical safety and reliability of the communication power supply system 200. In other words, the signal-driven collection module 17 collects the circuit breaker signal, to not only implement a function of detecting the status of the circuit breaker, but also implement functions including controlling the circuit breaker to be switched off and on, detecting a current of the circuit breaker, collecting an address of the circuit breaker, identifying the circuit breaker, and the like, provided that the monitoring module 207 can control and monitor the circuit breaker based on the circuit breaker signal collected by the signal-driven collection module 17.

According to the communication power supply system 200 in the first implementation of this disclosure, power is obtained by using the power busbar 11, the monitoring module 207 uses the circuit breaker signal of the circuit breaker 19 that is collected by the signal-driven collection module 17, to control on and off (namely, powering on and off) of the circuit breaker 19 of each of the primary load output module 13, the secondary load output module 14, and the battery module 15, and to monitor the status of the circuit breaker. In addition, the direct current power distribution module 10 does not use any contactor for powering on and off and does not use any current divider for current division. Therefore, no distinction is made on physical hardware between function areas accessed by the primary load, the secondary load, the battery, and the like, thereby improving flexibility of layout of the direct current power distribution module 10.

The monitoring module 207 is further configured to monitor a voltage of the battery 151, to control power supplied by the battery to the primary load 131 and the secondary load 141. When the battery 151 supplies power and a voltage of the battery 151 is less than a preset maximum threshold voltage, a power supply circuit for the battery 151 to supply power to the secondary load 141 is switched off. When the battery 151 supplies power and the voltage of the battery 151 is less than a preset minimum threshold voltage, a power supply circuit for the battery 151 to supply power to the primary load 131 and the secondary load 141 is switched off.

A working principle of the communication power supply system 200 shown in FIG. 1 is as follows. In a normal case, the rectifier module 203 supplies power to the primary load 131, the secondary load 141, and the battery 151. When the rectifier module 203 cannot supply power, the battery 151 supplies power to the primary load 131 and the secondary load 141. When the voltage of the battery 151 is greater than or equal to the preset maximum threshold voltage and greater than or equal to the preset minimum threshold voltage, the voltage of the battery 151 can be used for operation of both the primary load 131 and the secondary load 141, and when the voltage of the battery 151 is greater than or equal to the preset minimum threshold voltage and less than the preset maximum threshold voltage, the voltage of the battery 151 is insufficient for operation of both the primary load 131 and the secondary load 141, but can be sufficient for operation of the primary load 131. Therefore, the monitoring module 207 controls the circuit breaker 19 on the secondary load output module 14 to be switched off, to power off the secondary load output module 14, thereby ensuring normal operation of the primary load 131.

It may be understood that a quantity of circuit breakers 19 in the primary load output module 13 is not limited. For example, the primary load output module 13 may include one circuit breaker 19 and M primary loads 131, and the monitoring module 207 controls the M primary loads 131 by using the circuit breaker 19. A quantity of circuit breakers 19 in the secondary load output module 14 is not limited. The secondary load output module 14 may include one circuit breaker 19 and N secondary loads 141, and the monitoring module 207 controls the N secondary loads 141 by using the circuit breaker 19. A quantity of circuit breakers 19 in the battery module 15 is not limited. The battery module 15 may include one circuit breaker 19 and P batteries 151, and the monitoring module 207 controls the P batteries 151 by using the circuit breaker 19.

Figure 2:
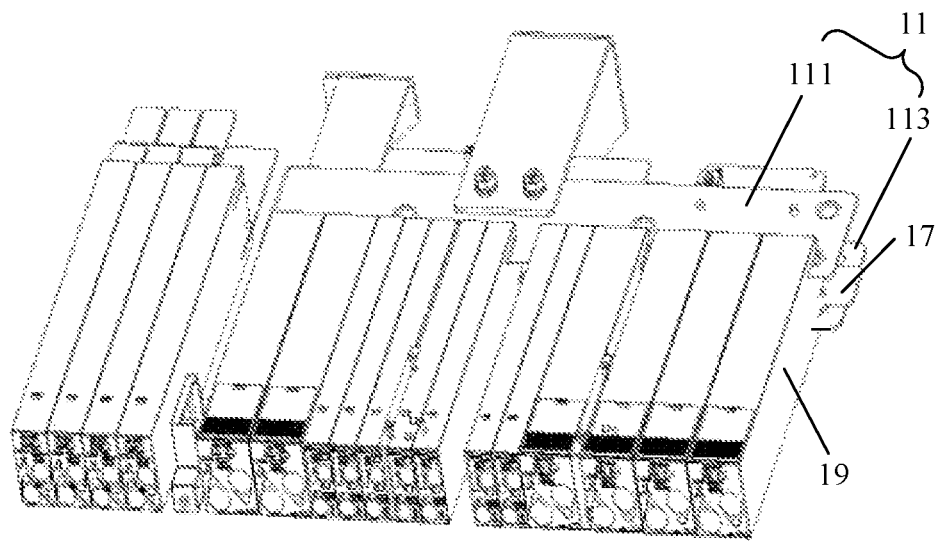
FIG. 2 is a schematic diagram of three-dimensional assembly of a direct current power distribution module according to a first implementation of this disclosure.
Figure 3:
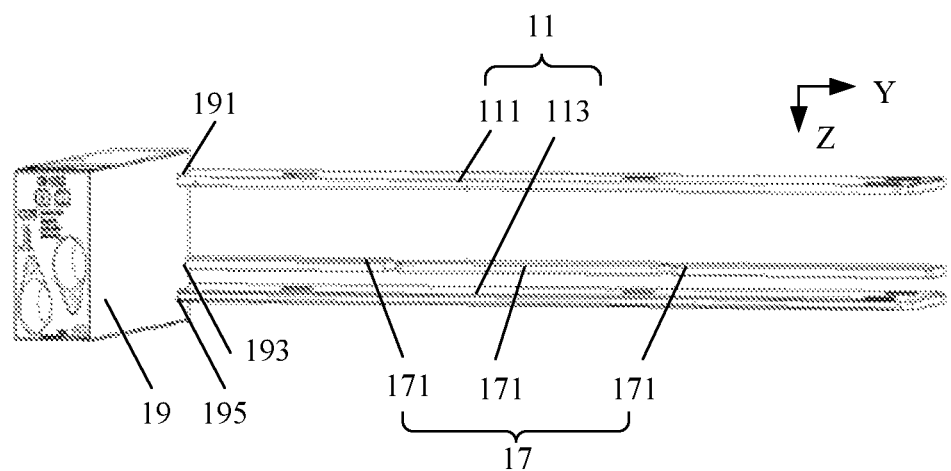
FIG. 3 is a schematic diagram of three-dimensional assembly of a circuit breaker with a power busbar and a signal-driven collection module shown in FIG. 2.

FIG. 2 is a schematic diagram of three-dimensional assembly of a direct current power distribution module according to a first implementation of this disclosure. FIG. 3 is a schematic diagram of three-dimensional assembly of a circuit breaker with a power busbar and a signal-driven collection module shown in FIG. 2. FIG. 3 shows an example of assembling only one circuit breaker 19 with a power busbar 11 and a signal-driven collection module 17, and other circuit breakers 19 are hidden. The circuit breaker 19 includes a first slot 191, an insertion slot 193, and a second slot 195 that are provided at intervals in a Z direction, where the insertion slot 193 is located between the first slot 191 and the second slot 195. The first slot 191, the insertion slot 193, and the second slot 195 are all through slots extending in a Y direction.

The power busbar 11 includes a positive power busbar 111 and a negative power busbar 113. The positive power busbar 111 is inserted into the first slot 191 to be connected to the circuit breaker 19, the negative power busbar 113 is inserted into the second slot 195 to be connected to the circuit breaker 19, and the signal-driven collection module 17 is inserted into the insertion slot 193 to be connected to the circuit breaker 19. The positive power busbar 111, the negative power busbar 113, and the signal-driven collection module 17 are stacked in the Z direction, where the signal-driven collection module 17 is located between the positive power busbar 111 and the negative power busbar 113.

Figure 4:
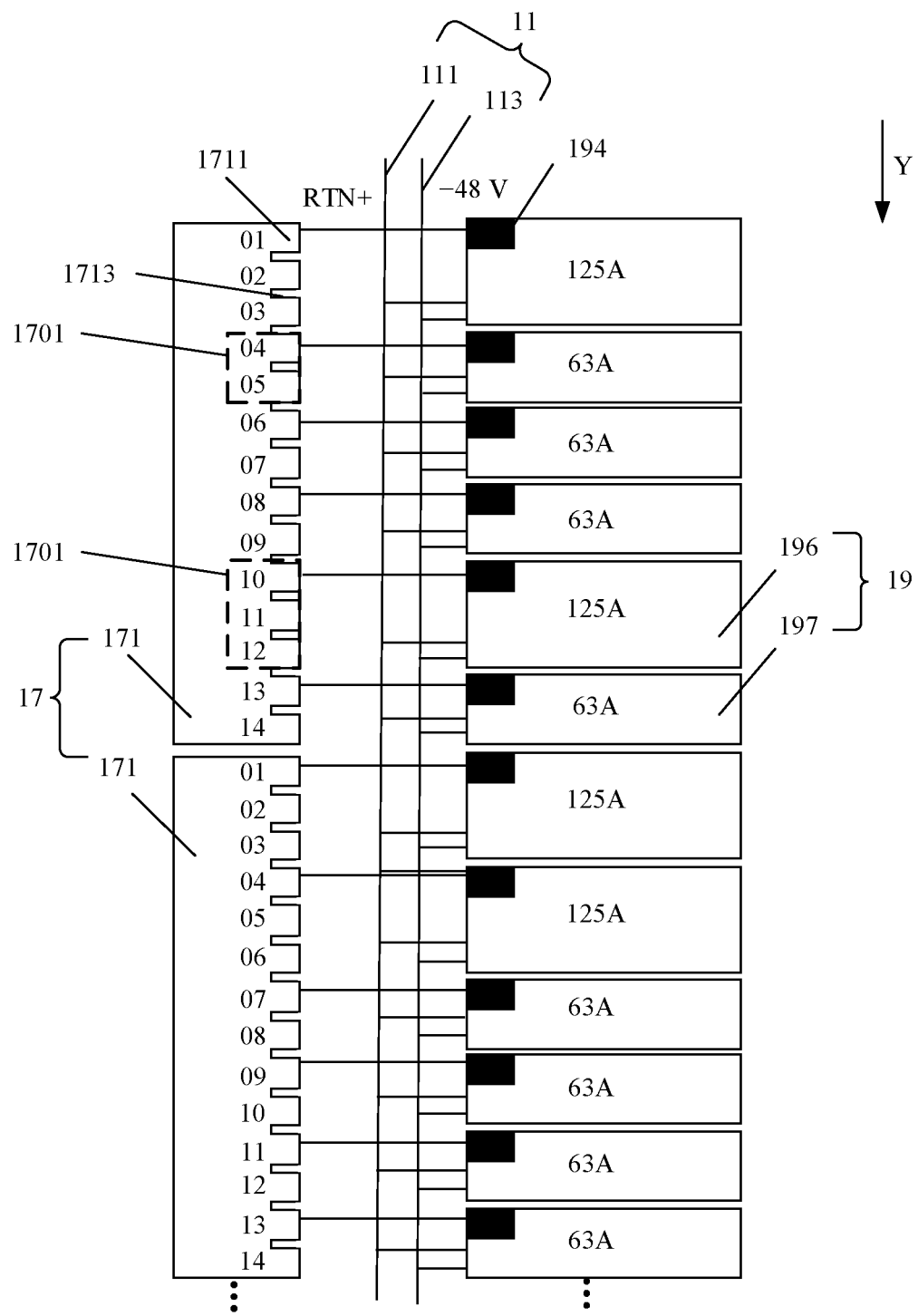
FIG. 4 is a schematic diagram of a direct current power distribution module in an application scenario.

FIG. 4 is a schematic diagram of a structure of a direct current power distribution module in an application scenario, where the signal-driven collection module 17 includes a plurality of signal collection boards 171. The plurality of signal collection boards 171 are disposed in parallel. For example, FIG. 4 shows only two signal collection boards 171.

The signal collection board 171 includes a plurality of first signal units 1711 and a plurality of guide slots 1713. The plurality of first signal units 1711 are sequentially arranged in a Y direction, and one guide slot 1713 is provided between every two adjacent first signal units 1711. In other words, the guide slot 1713 is of a guide structure used for guiding when the signal collection board 171 is inserted into the insertion slot 193, which facilitates assembly of the signal collection board 171 with the circuit breaker 19. In this implementation, the signal collection board 171 is generally comb-shaped, the first signal unit 1711 is generally of a tooth-shaped structure, and the guide slot 1713 is of a groove structure disposed between two adjacent first signal units 1711. FIG. 4 shows only an example in which each signal collection board 171 includes 14 first signal units 1711.

The plurality of first signal units 1711 have a same width, and the plurality of guide slots 1713 have a same width. In other words, the plurality of first signal units 1711 are disposed on the signal collection board 171 at an equal interval, which facilitates inserting the signal collection board 171 into the circuit breaker 19 for position limitation and fool-proofing. It may be understood that, that the plurality of first signal units 1711 are disposed at an equal interval is not limited, and that the plurality of guide slots 1713 have a same width is not limited.

An integer quantity of first signal units 1711 are disposed in a connection area 1701 in which the signal collection board 171 is connected to each circuit breaker 19. In other words, each circuit breaker 19 is disposed in the Y direction in a manner of corresponding to an integer quantity of first signal units 1711 of the signal-driven collection module 17, for example, one or two. An integer quantity of first signal units 1711 are disposed in a connection area 1701 in which the signal-driven collection board 171 is inserted into an insertion slot 193 of each circuit breaker 19, that is, each insertion slot 193 is provided in the Y direction in a manner of corresponding to an integer quantity of first signal units 1711. One second signal unit 194 is disposed in the insertion slot 193 of the circuit breaker 19. The second signal unit 194 interconnects with one first signal unit 1711 at a position corresponding to the signal collection board 171, so that the signal collection board 171 collects a circuit breaker signal of the circuit breaker 19 and feeds back the circuit breaker signal to the monitoring module 207. The first signal unit 1711 is a connection terminal, and the second signal unit 194 is a connection interface or is of another structure that can implement signal transmission therebetween.

In this implementation, the circuit breaker 19 includes a plurality of first circuit breakers 196 and a plurality of second circuit breakers 197. The first circuit breaker 196 and the second circuit breaker 197 have different widths. The first circuit breaker 196 is a 125-ampere (A) circuit breaker and the second circuit breaker 197 is a 63 A circuit breaker.

Assuming that the width of the first circuit breaker 196 is W1, and the width of the second circuit breaker 197 is W2, W1:W2=1.5:1. Three first signal units 1711 (numbered as 10 to 12 in FIG. 4) are disposed in a connection area 1701 in which the signal collection board 171 is connected to the first circuit breaker 196, that is, the first circuit breaker 196 is disposed in the Y direction in manner of corresponding to the three first signal units 1711. Two first signal units 1711 (numbered as 4 and 5 in FIG. 4) are disposed in a connection area 1701 in which the signal collection board 171 is connected to the second circuit breaker 197, that is, the second circuit breaker 197 is disposed in the Y direction in manner of corresponding to the two first signal units 1711.

The plurality of first signal units 1711 have a same tooth width, the plurality of guide slots 1713 have a same width, and the width of the first circuit breaker 196 and the width of the second circuit breaker 197 are set in the Y direction in a manner of corresponding to an integer quantity of first signal units 1711, so that the signal collection board 171 can be installed on the first circuit breaker 196 and the second circuit breaker 197 randomly without limitation, that is, hybrid insertion of the signal collection board 171 into the circuit breakers 19 on the primary load output module 13, the secondary load output module 14, and the battery module 15 can be implemented without limitation according to arrangement of the circuit breakers 19, thereby improving freedom of the primary load 131, the secondary load 141, and the battery 151 to access the communication power supply system 200.

It may be understood that, that W1:W2=1.5:1 is not limited, W1:W2 may be equal to another value, for example, 2:1, 1:1, 2:1, or the like.

Figure 5:
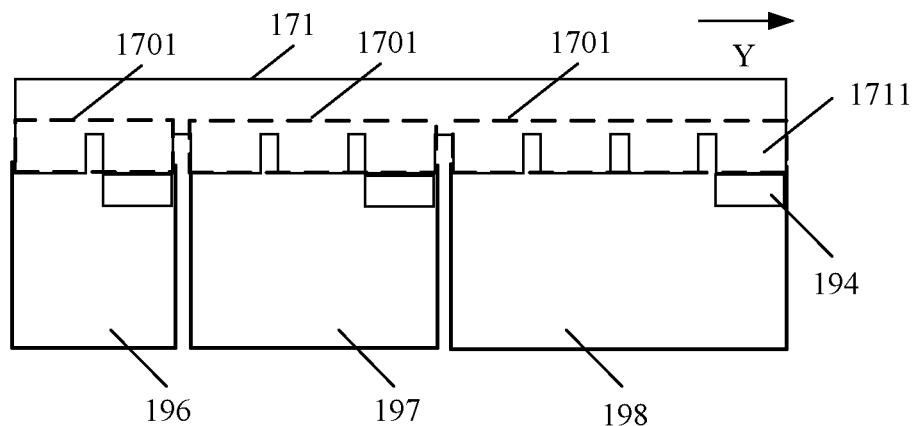
FIG. 5 is a schematic diagram of a partial structure of a direct current power distribution module in another application scenario.

In another application scenario, referring to FIG. 5, the signal collection board 171 is assembled with three circuit breakers 19 having different widths. The circuit breakers 19 include a first circuit breaker 196, a second circuit breaker 197, and a third circuit breaker 198. Assuming that a width of the first circuit breaker 196 is W1, a width of the second circuit breaker 197 is W2, and a width of the third circuit breaker 198 is W3, W1:W2:W3=1:1.5:2. In other words, two first signal units 1711 are disposed in a connection area 1701 in which the signal collection board 171 is connected to the first circuit breaker 196, three first signal units 1711 are disposed in a connection area 1701 in which the signal collection board 171 is connected to the second circuit breaker 197, and four first signal units 1711 are disposed in a connection area 1701 in which the signal collection board 171 is connected to the third circuit breaker 198.

Figure 6:
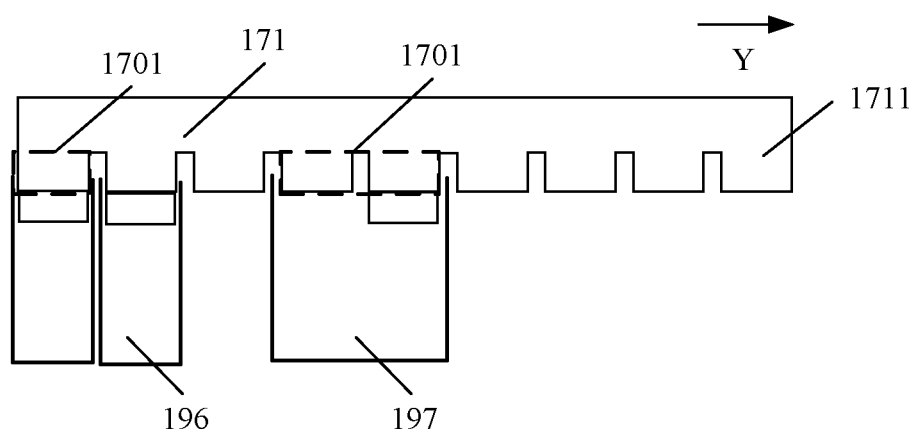
FIG. 6 is a schematic diagram of a partial structure of a direct current power distribution module in still another application scenario.

In still another application scenario, referring to FIG. 6, the signal collection board 171 is assembled with two circuit breakers 19 having different widths. The circuit breakers 19 include a first circuit breaker 196 and a second circuit breaker 197. Assuming that a width of the first circuit breaker 196 is W1 and a width of the second circuit breaker 197 is W2, W1:W2=0.5:1. That is, the width W1 of the first circuit breaker 196 is approximately the same as that of one first signal unit 1711, one first signal unit 1711 is disposed in a connection area 1701 in which the signal collection board 171 is connected to the first circuit breaker 196, and two first signal units 1711 are disposed in a connection area 1701 in which the signal collection board 171 is connected to the second circuit breaker 197.

It may be understood that, a structure of the direct current power distribution module in this implementation may also be applied to an alternating current power distribution module. In an implementation, a power distribution module includes a power busbar, a primary load output module, a secondary load output module, a battery module, and a signal-driven collection module, where each of the primary load output module, the secondary load output module, and the battery module includes a circuit breaker, the power busbar is connected to the circuit breaker, the signal-driven collection module is connected to the circuit breaker to collect a circuit breaker signal, the signal-driven collection module includes a plurality of first signal units sequentially arranged in a first direction, an integer quantity of first signal units are disposed in a connection area in which the signal-driven collection module is connected to each circuit breaker, each circuit breaker is provided with a second signal unit, and the second signal unit interconnects with one of the first signal units, implementing that the signal-driven collection module collects a circuit breaker signal of the circuit breaker and feeds back the circuit breaker signal to a monitoring module.

It may be understood that the power busbar includes at least one of a direct current positive electrode, a direct current negative electrode, a ground bar, an alternating current L1-phase bar, an alternating current L2-phase bar, an alternating current L3-phase bar, and an alternating current N-phase bar. This is not limited herein.

It may be understood that the signal-driven collection module 17 may alternatively include only one signal collection board 171. That a plurality of first signal units 1711 have a same width is not limited, and that a plurality of guide slots 1713 have a same width is not limited, that is, a plurality of first signal units 1711 are disposed on the signal collection board 171 at intervals, and an integer quantity of first signal units 1711 are disposed in a connection area 1701 in which the signal-driven collection module 17 is connected to each circuit breaker 19, provided that the second signal unit 194 interconnects with one of the integer quantity of first signal units 1711 in the connection area 1701.

It may be understood that, the first slot 191 is not limited to a through slot, provided that the positive power busbar 111 can be inserted into the first slot 191, the insertion slot 193 is not limited to a through slot, provided that the signal collection board 171 can be inserted into the insertion slot 193, and the second slot 195 is not limited to a through slot, provided that the negative power busbar 113 can be inserted into the second slot 195.

It may be understood that, that connection between the signal-driven collection module 17 and the circuit breaker 19 is implemented by using the insertion slot 193 is not limited, and the connection therebetween may alternatively be implemented in another manner. For example, a slot is provided in the signal-driven collection module 17, and the circuit breaker 19 is provided with a plug part that can be inserted into the slot of the signal-driven collection module 17. This is not limited herein.

Figure 7:
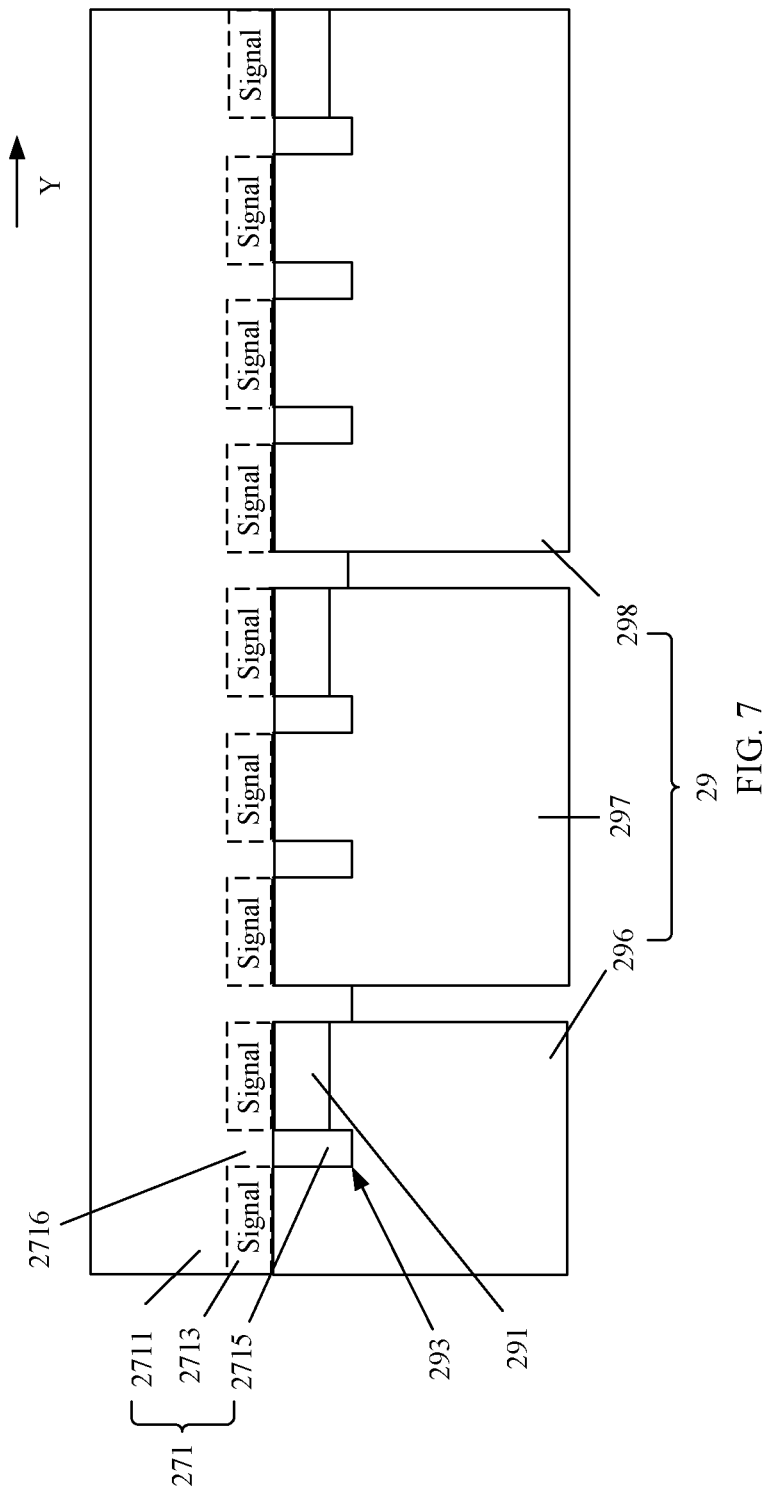
FIG. 7 is a schematic diagram of assembly of a signal collection board with a circuit breaker according to a second implementation of this disclosure.
Figure 8:
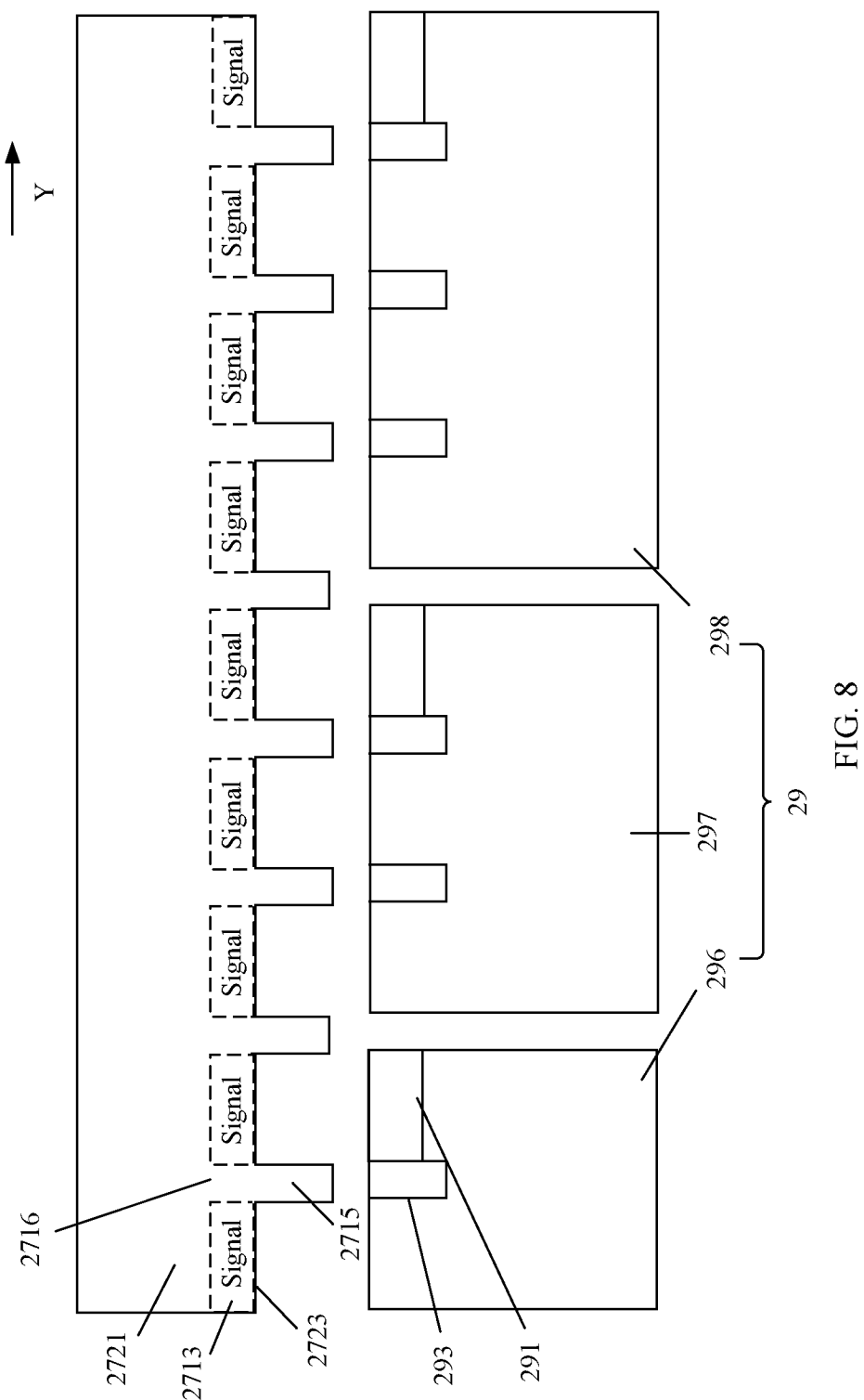
FIG. 8 is a schematic diagram of disassembly of a signal collection board from a circuit breaker shown in FIG. 7.

Second Implementation:

FIG. 7 is a schematic planar diagram of assembly of a signal-driven collection module with a circuit breaker according to a second implementation of this disclosure. FIG. 8 is a schematic planar diagram of disassembly of a signal-driven collection module from a circuit breaker shown in FIG. 7. A structure of a power distribution module provided in the second implementation is generally the same as that of the direct current power distribution module 10 provided in the first implementation. A difference between the structures lies in that a part of a structure of a signal-driven collection module 271 and a part of a structure of a circuit breaker 29 are respectively different from those of the signal-driven collection module and the circuit breaker provided in the first implementation.

Further, the signal-driven collection module 271 includes a main body 2711, a plurality of first signal units 2713, and a plurality of guide pillars 2715. The main body 2711 includes a first surface 2721 and a second surface 2723 formed by bending and extending the first surface 2721. The plurality of first signal units 2713 are disposed on the first surface 2721 of the main body 2711 at an equal interval, there is a gap 2716 between every two adjacent first signal units 2713, the plurality of guide pillars 2715 are disposed on the second surface 2723 of the main body 2711 in a protruding manner at an equal interval, and each guide pillar 2715 is disposed in a manner of corresponding to one gap 2716.

The circuit breaker 29 is provided with a second signal unit 291 and a guide slot 293 in an insertion slot (not shown in the figure), and the second signal unit 291 is configured to interconnect with the first signal unit 2713. Each guide pillar 2715 is inserted into one guide slot 293 in a matched manner. When the signal-driven collection module 271 is inserted into the second circuit breaker 29, the main body 2711 is partially accommodated in the insertion slot, the first signal unit 2713 interconnects with a corresponding second signal unit 291, and the guide pillar 2715 is accommodated in the guide slot 293. The guide pillar 2715 and the guide slot 293 form a guide structure.

It may be understood that, that the guide pillar 2715 is disposed on the second surface 2723 in a protruding manner is not limited. For example, the guide pillar 2715 may alternatively be disposed on the first surface 2721 or another surface in a protruding manner.

The circuit breaker 29 includes a first circuit breaker 296, a second circuit breaker 297, and a third circuit breaker 298. The signal-driven collection module 271 is inserted into the first circuit breaker 296, the second circuit breaker 297, and the third circuit breaker 298, and the second circuit breaker 297 is located between the first circuit breaker 296 and the third circuit breaker 298.

Figure 9:
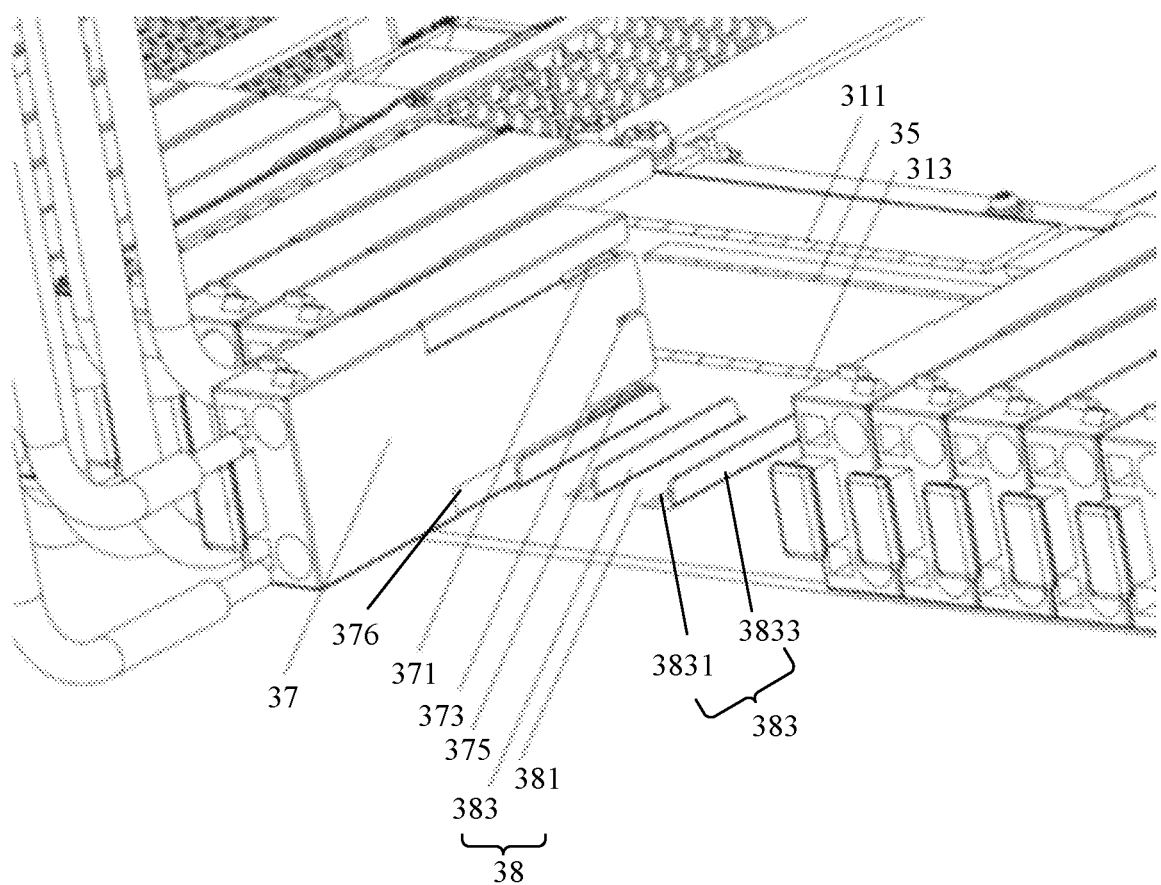
FIG. 9 is a schematic diagram of three-dimensional assembly of a partial structure of a power distribution module according to a third implementation of this disclosure.

Third Implementation:

FIG. 9 is a schematic diagram of three-dimensional assembly of a partial structure of a power distribution module according to a third implementation of this disclosure. A structure of the power distribution module provided in the third implementation is generally the same as that of the direct current power distribution module 10 provided in the first implementation. A difference between the structures lies in that a part of a structure of a circuit breaker 37 is different from that of the circuit breaker provided in the first implementation.

Furthermore, the power distribution module further includes a support frame 38, which is configured to support the circuit breaker 37. The support frame 38 includes a support body 381 and a plurality of guide members 383 sequentially disposed on the support body 381 in a protruding manner at an equal interval. The guide member 383 is generally of an edge bending structure and includes a connection part 3831 and a guide part 3833 formed by bending and extending an edge of the connection part 3831 in a direction away from the support body 381. The connection part 3831 is fixedly connected to the support body 381.

The circuit breaker 37 is provided with a first slot 371, an insertion slot 373, and a second slot 375. A positive power busbar 311 is inserted into the first slot 371, a signal-driven collection module 35 is inserted into the insertion slot 373, and a negative power busbar 313 is inserted into the second slot 375. A guide slot 376, into which the guide member 383 is inserted in a matched manner, is also provided in the circuit breaker 37, and is configured to facilitate assembling the circuit breaker 37 on the support frame 38. The guide member 383 and the guide slot 376 form a guide structure.

Figure 10:
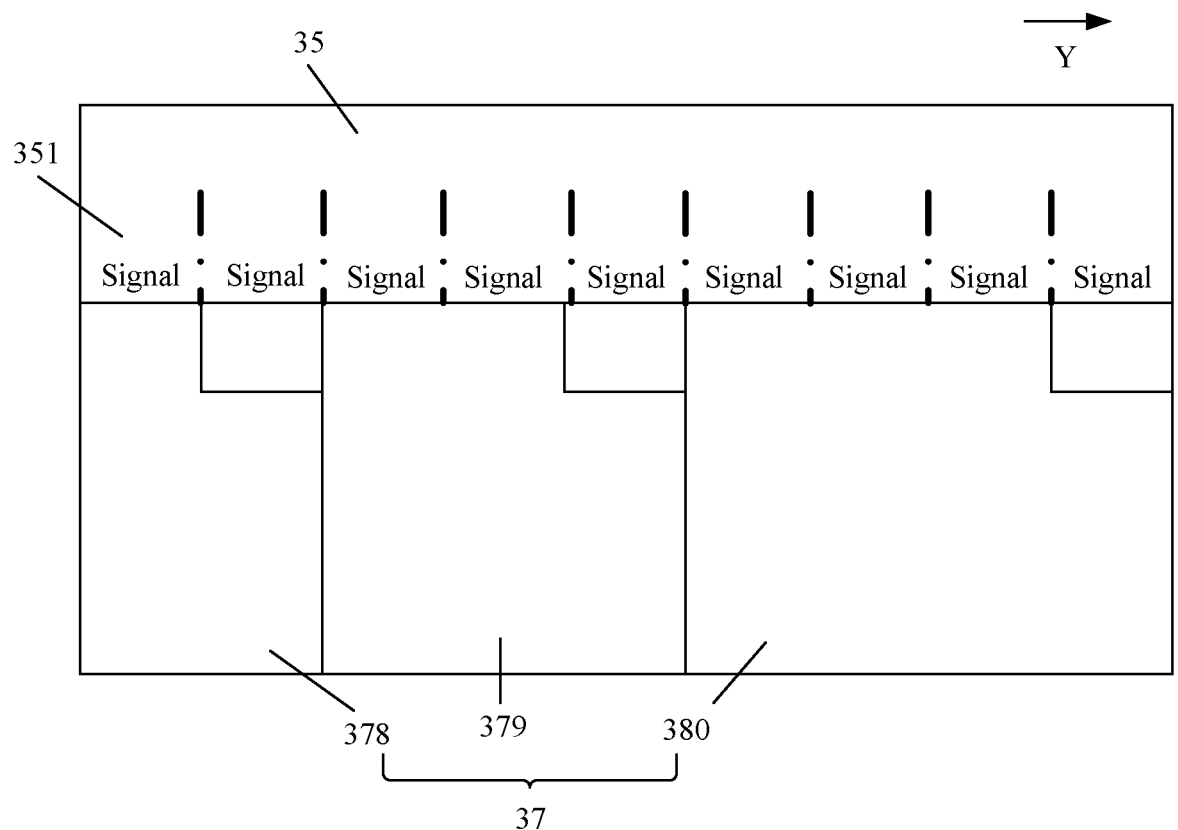
FIG. 10 is a schematic planar diagram of assembly of a circuit breaker with a signal collection board according to a third implementation of this disclosure.

FIG. 10 is a schematic planar diagram of assembly of a circuit breaker with a signal-driven collection module according to a third implementation of this disclosure. A signal-driven collection module 35 includes a plurality of first signal units 351 disposed side by side in a Y direction. The circuit breaker 37 includes a first circuit breaker 378, a second circuit breaker 379, and a third circuit breaker 380 having different widths. Assuming that the width of the first circuit breaker 378 is W1, the width of the second circuit breaker 379 is W2, and the width of the third circuit breaker 380 is W3, W1:W2:W3=1:1.5:2. In this implementation, two adjacent guide parts 3833 have a same width as a first signal unit 351 and correspond to one signal unit 351.

During assembly, the guide part 3833 is inserted into a guide slot 376 of the circuit breaker 37. Because two adjacent guide parts 3833 have a same width as the first signal unit 351, an integer quantity of first signal units 351 are to be disposed correspondingly when the signal-driven collection module 35 is inserted into the circuit breaker 37, thereby facilitating hybrid insertion of the signal-driven collection module 35 into a circuit breaker 37 of each function module without limitation, improving efficiency of assembling the signal-driven collection module 35 with the circuit breaker 37, and also improving precision of connection between the signal-driven collection module 35 and the circuit breaker 37.

Figure 11:
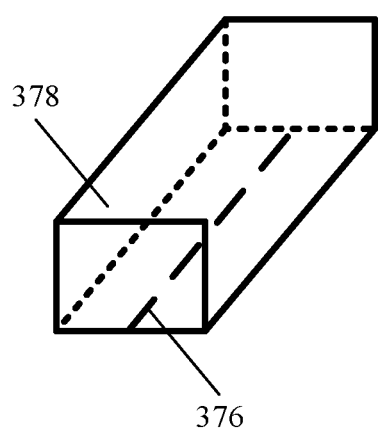
FIG. 11 is a schematic diagram of a position of a guide slot of a first circuit breaker.
Figure 12:
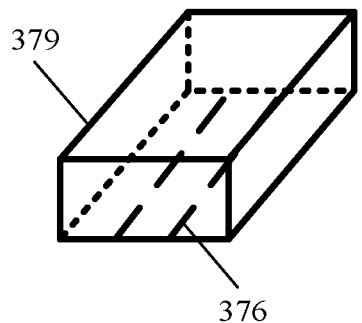
FIG. 12 is a schematic diagram of a position of a guide slot of a second circuit breaker.
Figure 13:
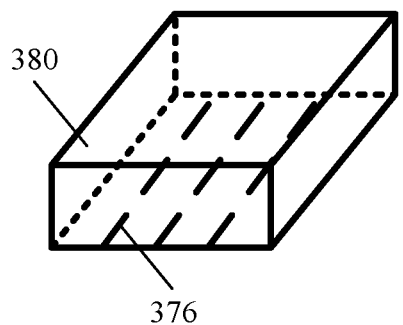
FIG. 13 is a schematic diagram of a position of a guide slot of a third circuit breaker.

Referring to FIG. 11, the guide slot 376 of the first circuit breaker 378 is provided in a bottom surface, facing the support body 381, of the first circuit breaker 378 at a position approximately ½ of a width of the bottom surface. Referring to FIG. 12, the guide slots 376 of the second circuit breaker 379 are provided in a bottom surface, facing the support body 381, of the first circuit breaker 378 at positions approximately ⅓ and ⅔ of a width of the bottom surface. Referring to FIG. 13, the guide slots 376 of the third circuit breaker 380 are provided in a bottom surface, facing the support body 381, of the third circuit breaker 380 at positions approximately ¼, ½, and ¾ of a width of the bottom surface.

It may be understood that, that a plurality of guide members 383 are disposed on the support body 381 in a protruding manner at an equal interval is not limited.

Figure 14:
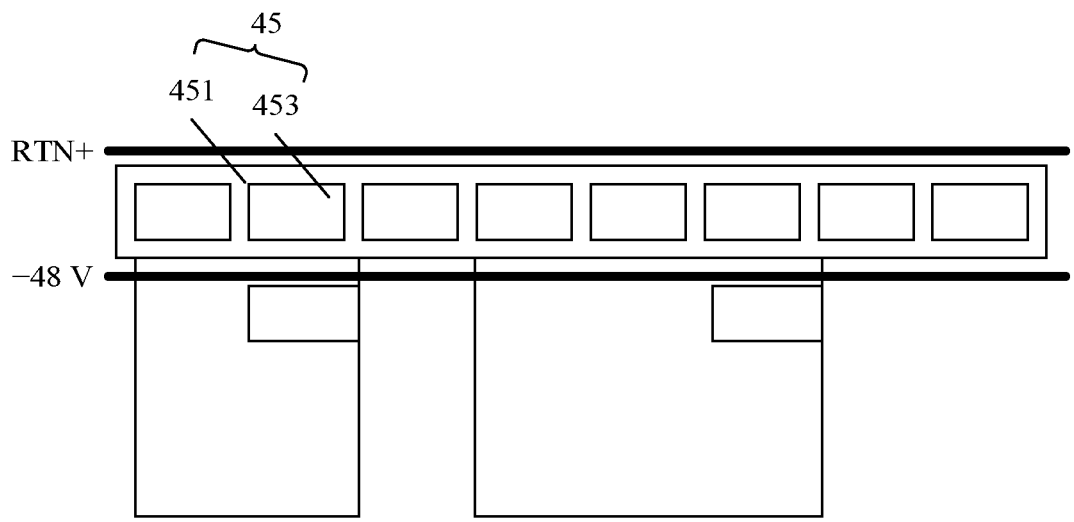
FIG. 14 is a schematic diagram of a partial structure of a power distribution module according to a fourth implementation of this disclosure.

Fourth Implementation:

FIG. 14 is a schematic diagram of three-dimensional assembly of a partial structure of a power distribution module according to a fourth implementation of this disclosure. A structure of the power distribution module provided in the fourth implementation is generally the same as that of the direct current power distribution module 10 provided in the first implementation. A difference between the structures lies in that a structure of a signal-driven collection module 45 is different from that of the signal-driven collection module provided in the first implementation.

The signal-driven collection module 45 includes a main body 451 and a plurality of first signal units 453 sequentially arranged on the main body 451. The first signal unit 453 is an elastic terminal, that is, the first signal unit 453 has an elastic deformation capability. Because the first signal unit 453 is an elastic terminal, the first signal unit 453 can float to automatically adjust a position of the first signal unit 453 when the first signal unit 453 interconnects with a second signal unit, so that the first signal unit 453 precisely interconnects with the second signal unit, thereby improving precision of interconnection between the first signal unit 453 and the second signal unit. In this implementation, a material of which the first signal unit 453 is made includes electrically conductive plastics. It may be understood that the material of which the first signal unit 453 is made is not limited to electrically conductive plastics, and may be another elastic material. For example, the first signal unit 453 is a metal elastic piece. A structure of the first signal unit 453 is not limited. The first signal unit 453 includes a flexible body (not shown in the figure) and a signal collection part disposed on the flexible body, the flexible body is fixedly connected to the main body 451, and the signal collection part interconnects with the second signal unit.

The foregoing descriptions are merely specific implementations of this disclosure, but are not intended to limit the protection scope of the present disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A power distribution system and a monitoring module, the power distribution system comprising:
    a power busbar;
    a primary load output system;
    a secondary load output system;
    a battery system to selectively provide power to at least one of the primary load system or the secondary load system; and
    a signal-driven collection system comprising a plurality of first signal components is sequentially arranged in a first direction, the first signal components each has an identical unit length in the first direction,
    wherein the power busbar is coupled to a plurality of circuit breakers, each of the circuit breakers selected from a group that has a width corresponds to an integer multiple of the unit length of each of the first signal components,
    wherein each of the primary load output system, and the secondary load output system comprises a circuit breaker of the plurality of circuit breakers,
    wherein the signal-driven collection system is configured to connect to the circuit breakers where the widths are different from each other,
    wherein the signal-driven collection system is connected to the plurality of circuit breakers to collect a circuit breaker signal,
    wherein an integer quantity of the first signal components is disposed in a connection area in which the signal-driven collection system is connected to each circuit breaker of the plurality of circuit breakers,
    wherein each circuit breaker of the plurality of circuit breakers comprises a second signal component configured to interconnect with a corresponding one of the first signal components, and
    wherein the monitor module is configured to receive the circuit breaker signal collected by the signal-driven collection module, and to control and monitor each of the circuit breakers.

2. The power distribution system and the monitoring module of claim 1, wherein each circuit breaker of the plurality of circuit breakers comprises an insertion slot, wherein the signal-driven collection system is configured to insert into the insertion slot of each circuit breaker, wherein the insertion slot is configured to extend in the first direction, wherein the integer quantity of the first signal components is disposed in the connection area in which the signal-driven collection system is inserted into the insertion slot, and wherein the second signal component is disposed in the insertion slot.

3. The power distribution system and the monitoring module of claim 2, wherein the signal-driven collection system further comprises a guide slot disposed between every two adjacent ones of the first signal components.

4. The power distribution system and the monitoring module of claim 3, wherein each circuit breaker of the plurality of circuit breakers further comprises:
    a first slot; and
    a second slot,
    wherein the first slot, the insertion slot, and the second slot are disposed at intervals in a second direction different from the first direction, and
    wherein the power busbar comprises:
        a positive power busbar configured to insert into the first slot; and
        a negative power busbar configured to insert into the second slot.

5. The power distribution system and the monitoring module of claim 2, wherein the signal-driven collection system further comprises:
    a main body inserted into the insertion slot of each circuit breaker; and
    a plurality of guide pillars disposed on the main body in a protruding manner, wherein the plurality of first signal components is disposed on the main body at intervals in the first direction, and wherein one of the guide pillars is accommodated in the insertion slot.

6. The power distribution system and the monitoring module of claim 5, wherein each circuit breaker further comprises a guide slot disposed in the insertion slot, wherein each of the guide pillars is configured to insert into one guide slot in a matched manner.

7. The power distribution system and the monitoring module of claim 5, wherein each circuit breaker of the plurality of circuit breakers further comprises:
    a first slot; and
    a second slot,
    wherein the first slot, the insertion slot, and the second slot are disposed at intervals in a second direction different from the first direction, and
    wherein the power busbar comprises:
        a positive power busbar configured to insert into the first slot; and
        a negative power busbar configured to insert into the second slot.

8. The power distribution system and the monitoring module of claim 2, wherein the power distribution system further comprises a support frame, wherein the support frame comprises:
    a support body; and
    a plurality of guide members disposed on the support body in a protruding manner at intervals in the first direction,
    wherein each circuit breaker further comprises a guide slot matched with a respective one of the guide members.

9. The power distribution system and the monitoring module of claim 8, wherein each of the guide members comprises:
    a connection part fixedly coupled to the support body and comprising a side edge; and a guide part formed by bending and extending the side edge of the connection part in a direction away from the support body, wherein a distance between every two adjacent ones of the guide parts corresponds to the unit length of each of the first signal components and are aligned in a manner corresponding to the unit length of each of the first signal components.

10. The power distribution system and the monitoring module of claim 2, wherein the signal-driven collection system further comprises a main body, wherein the plurality of first signal components is disposed on the main body in a protruding manner at equal intervals, and wherein each of the first signal components is an elastic terminal.

11. The power distribution system and the monitoring module of claim 2, wherein each circuit breaker of the plurality of circuit breakers further comprises:
   a first slot; and
   a second slot,
   wherein the first slot, the insertion slot, and the second slot are disposed at intervals in a second direction different from the first direction, and
   wherein the power busbar comprises:
      a positive power busbar configured to insert into the first slot; and
      a negative power busbar configured to insert into the second slot.

12. A communication power supply system comprising:
   a rectifier system;
   a power distribution system comprising:
      a power busbar coupled to the rectifier system;
      a primary load output system;
      a secondary load output system;
      a battery system to selectively provide power to at least one of the primary load system or the secondary load system; and
      a signal-driven collection system comprising a plurality of first signal components sequentially arranged in a first direction, the first signal components each has an identical unit length in the first direction,
      wherein the power busbar is further coupled to a plurality of circuit breakers, each of the circuit breakers selected from a group that has a width corresponds to an integer multiple of the unit length of each of the first signal components,
      wherein each of the primary load output system, the secondary load output system, and the battery system comprises a circuit breaker of the plurality of circuit breakers,
      wherein the signal-driven collection system is connected to the plurality of circuit breakers to collect a circuit breaker signal,
      wherein the signal-driven collection system is configured to connect to the circuit breakers where the widths of the circuit breakers are different from each other,
      wherein an integer quantity of the first signal components is disposed in a connection area in which the signal-driven collection system is coupled to each circuit breaker of the plurality of circuit breakers, and
      wherein each circuit breaker of the plurality of circuit breakers comprises a second signal component configured to interconnect with a corresponding one of the first signal components; and
   a monitoring system configured to receive the circuit breaker signal to control and monitor each circuit breaker of the plurality of circuit breakers.

13. The communication power supply system of claim 12, wherein the primary load output system further comprises at least one primary load connected to the circuit breaker of the primary load output system, wherein the secondary load output system comprises at least one secondary load connected to the circuit breaker of the secondary load output system, wherein the battery system comprises at least one battery connected to the circuit breaker of the battery system, and wherein the monitoring system is further configured to monitor a voltage of the at least one battery on the battery system to control the at least one battery to supply power to the at least one primary load and the at least one secondary load.

14. The communication power supply system of claim 13, wherein when the voltage of the at least one battery is greater than or equal to a preset maximum threshold voltage and greater than or equal to a preset minimum threshold voltage, the monitoring system is further configured to control the at least one battery to supply the power to the at least one primary load and the at least one secondary load.

15. The communication power supply system of claim 13, wherein when the voltage of the at least one battery is greater than or equal to a preset minimum threshold voltage and less than a preset maximum threshold voltage, the monitoring system is further configured to control the at least one battery to supply the power to the at least one primary load.

16. The communication power supply system of claim 13, wherein each circuit breaker of the plurality of circuit breakers comprises an insertion slot, wherein the signal-driven collection system is configured to insert into the insertion slot of each circuit breaker, wherein the insertion slot is configured to extend in the first direction, wherein the integer quantity of the first signal components is disposed in the connection area in which the signal-driven collection system is inserted into the insertion slot, and wherein the second signal component is disposed in the insertion slot.

17. The communication power supply system of claim 16, wherein the signal-driven collection system further comprises a guide slot disposed between every two adjacent ones of the first signal components.

18. The communication power supply system of claim 16, wherein the signal-driven collection system further comprises:
   a main body inserted into the insertion slots; and
   a plurality of guide pillars disposed on the main body in a protruding manner, wherein the plurality of first signal components is disposed on the main body at intervals in the first direction, and wherein one of the guide pillars is accommodated in the insertion slot.

19. The communication power supply system of claim 18, wherein the power distribution system further comprises a guide slot disposed in the insertion slot, and wherein each of the guide pillars is configured to insert into one guide slot in a matched manner.

20. The communication power supply system of claim 16, wherein the power distribution system further comprises a support frame, and wherein the support frame comprises:
   a support body; and
   a plurality of guide members disposed on the support body in a protruding manner at intervals in the first direction, wherein each circuit breaker of the plurality of circuit breakers further comprises a guide slot matched with a respective one of the guide members.

\* \* \* \* \*

UNITED STATES PATENT AND TRADEMARK OFFICE
CERTIFICATE OF CORRECTION

PATENT NO. : 12,119,622 B2
APPLICATION NO. : 17/848740
DATED : October 15, 2024
INVENTOR(S) : Yanxing Yang et al.

Page 1 of 1

It is certified that error appears in the above-identified patent and that said Letters Patent is hereby corrected as shown below:

On the Title Page

Page 2, (56) References Cited, Foreign Patent: "IN 110048310 A 7/2019" should read "CN 110048310 A 7/2019"

Signed and Sealed this
Nineteenth Day of November, 2024

Katherine Kelly Vidal
*Director of the United States Patent and Trademark Office*